US007763978B2

(12) United States Patent
Wu et al.

(10) Patent No.: US 7,763,978 B2
(45) Date of Patent: Jul. 27, 2010

(54) THREE-DIMENSIONAL CROSSBAR ARRAY SYSTEMS AND METHODS FOR WRITING INFORMATION TO AND READING INFORMATION STORED IN THREE-DIMENSIONAL CROSSBAR ARRAY JUNCTIONS

(75) Inventors: Wei Wu, Mountain View, CA (US); R. Stanley Williams, Portola Valley, CA (US); Warren Robinett, Chapel Hill, NC (US); Gregory S. Snider, Mountain View, CA (US); Zhaoning Yu, Mountain View, CA (US); Shih-Yuan Wang, Palo Alto, CA (US); Duncan Stewart, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 790 days.

(21) Appl. No.: 11/729,228

(22) Filed: Mar. 28, 2007

(65) Prior Publication Data
US 2008/0237886 A1   Oct. 2, 2008

(51) Int. Cl.
*H01L 23/52* (2006.01)
*H01L 23/48* (2006.01)
*H01L 29/40* (2006.01)

(52) U.S. Cl. .............. 257/758; 257/776; 257/E29.245; 977/762

(58) Field of Classification Search ................. 257/758, 257/E23.01; 977/762
See application file for complete search history.

(56) References Cited

U.S. PATENT DOCUMENTS

| 6,256,767 | B1 | 7/2001 | Kuekes et al. |
| 6,466,512 | B1 | 10/2002 | Hogan et al. |
| 6,870,394 | B2 | 3/2008 | Kuekes |
| 2005/0193356 | A1 | 9/2005 | Kuekes et al. |

OTHER PUBLICATIONS

Andre Dehon, Nanowire-Based Programmable Architectures, ACM Journal on Emerging Technologies in Computing Systems, vol. 1, No. 2, Jul. 2005. pp. 109-162.*

* cited by examiner

Primary Examiner—Kiesha R Bryant
Assistant Examiner—Igwe U Anya

(57) ABSTRACT

Various embodiments of the present invention are directed to three-dimensional crossbar arrays. In one aspect of the present invention, a three-dimensional crossbar array includes a plurality of crossbar arrays, a first demultiplexer, a second demultiplexer, and a third demultiplexer. Each crossbar array includes a first layer of nanowires, a second layer of nanowires overlaying the first layer of nanowires, and a third layer of nanowires overlaying the second layer of nanowires. The first demultiplexer is configured to address nanowires in the first layer of nanowires of each crossbar array, the second demultiplexer is configured to address nanowires in the second layer of nanowires of each crossbar array, and the third demultiplexer is configured to supply a signal to the nanowires in the third layer of nanowires of each crossbar array.

20 Claims, 16 Drawing Sheets

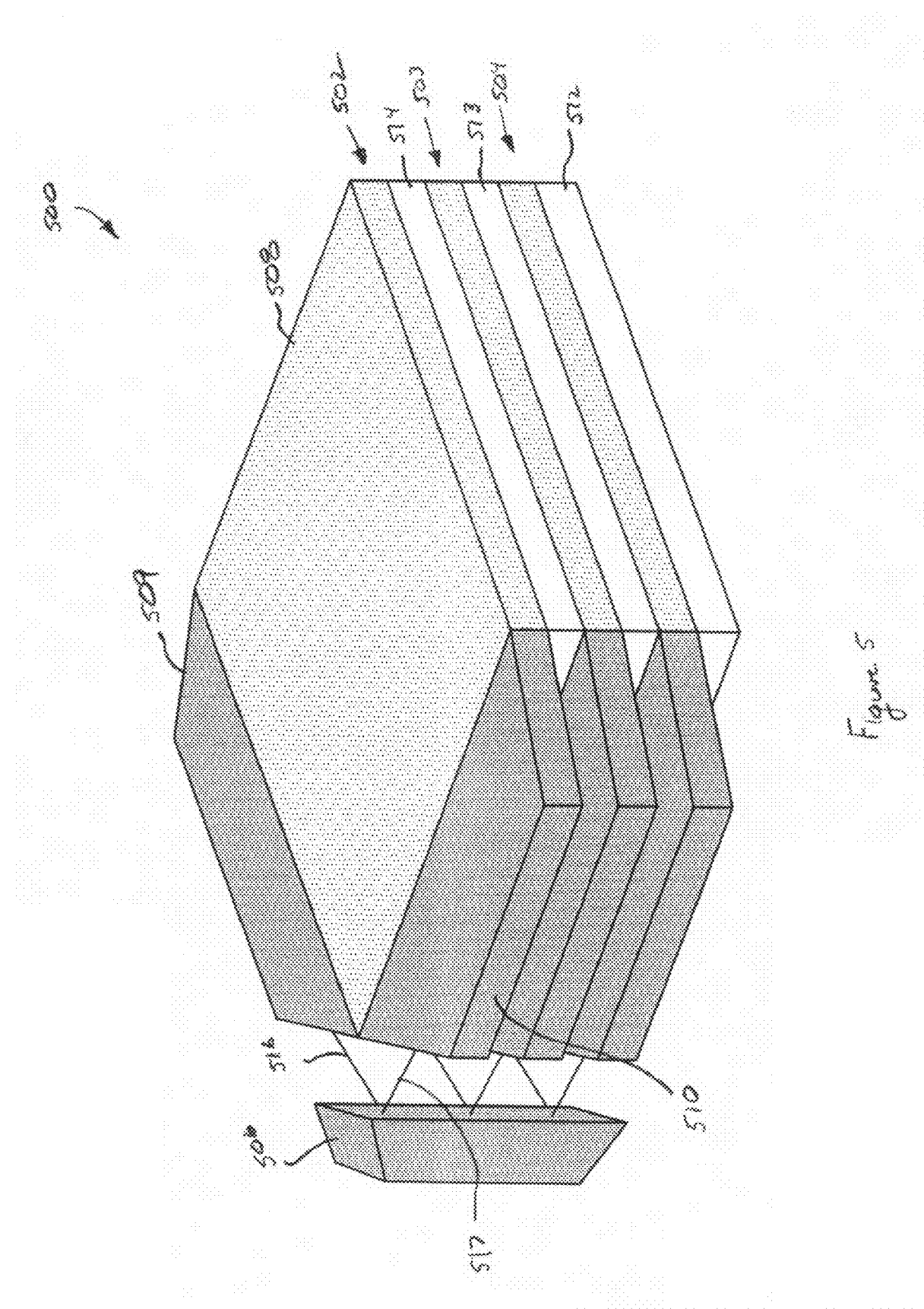

THREE-DIMENSIONAL CROSSBAR ARRAY SYSTEMS AND METHODS FOR WRITING INFORMATION TO AND READING INFORMATION STORED IN THREE-DIMENSIONAL CROSSBAR ARRAY JUNCTIONS

TECHNICAL FIELD

Embodiments of the present invention are directed to crossbar circuits, and, in particular, to three-dimensional crossbar arrays.

BACKGROUND

During the past fifty years, the electronics and computing industries have been relentlessly propelled forward by ever decreasing sizes of basic electronic components, such as transistors and signal lines, and by correspondingly ever increasing component densities of integrated circuits, including processors and electronic memory chips. Eventually, however, it is expected that fundamental component-size limits will be reached in semiconductor-circuit-fabrication technologies based on photolithographic methods. As the size of components decreases below the resolution limit of ultraviolet light, for example, far more technically demanding and expensive higher-energy-radiation-based technologies need to be employed to create smaller components using photolithographic techniques. Expensive semiconductor fabrication facilities may need to be rebuilt in order to use the new techniques. Many new obstacles are also expected to be encountered. For example, it is necessary to fabricate semiconductor devices through a series of photolithographic steps, with precise alignment of masks used in each step with respect to the components already fabricated on the surface of a nascent semiconductor. As the component sizes decrease, precise alignment becomes more and more difficult and expensive. As another example, the probabilities that certain types of randomly distributed defects in semiconductor surfaces result in defective semiconductor devices may increase as the sizes of components manufactured on the semiconductor surfaces decrease, resulting in an increasing proportion of defective devices during manufacture, and a correspondingly lower yield of useful product. Ultimately, various quantum effects that arise only at molecular-scale distances may altogether overwhelm current approaches to component fabrication in semiconductors.

In view of these problems, researchers and developers have expended considerable research effort in fabricating submicroscale and nanoscale electronic devices using alternative technologies. Nanoscale electronic devices generally employ nanoscale signal lines having widths, and nanoscale components having dimensions, of less than 100 nanometers. More densely fabricated nanoscale electronic devices may employ nanoscale signal lines having widths, and nanoscale components having dimensions, of less than 50 nanometers.

Although general nanowire technologies have been developed, it is not necessarily straightforward to employ nanowire technologies to miniaturize existing types of circuits and structures. While it may be possible to tediously construct miniaturized, nanowire circuits similar to the much larger, current circuits, it is impractical, and often impossible, to manufacture such miniaturized circuits using current technologies. Even were such straightforwardly miniaturized circuits able to be feasibly manufactured, the much higher component densities that ensue from combining together nanoscale components necessitate much different strategies related to removing waste heat produced by the circuits. In addition, the electronic properties of substances may change dramatically at nanoscale dimensions, so that different types of approaches and substances may need to be employed for fabricating even relatively simple, well-known circuits and subsystems at nanoscale dimensions. Designers, manufacturers, and users of electronic devices have also recognized a need for ways to configure nanoscale components in order to increase the density of electronic components in electronic devices.

SUMMARY

Various embodiments of the present invention are directed to three-dimensional crossbar array systems. In one aspect of the present invention, a three-dimensional crossbar array system includes a plurality of crossbar arrays, a first demultiplexer, a second demultiplexer, and a third demultiplexer. Each crossbar array includes a first layer of nanowires, a second layer of nanowires overlaying the first layer of nanowires, and a third layer of nanowires overlaying the second layer of nanowires. The first demultiplexer is configured to address nanowires in the first layer of nanowires of each crossbar array, the second demultiplexer is configured to address nanowires in the second layer of nanowires of each crossbar array, and the third demultiplexer is configured to supply a signal to the nanowires in the third layer of nanowires of each crossbar array.

BRIEF DESCRIPTION OF THE DRAWINGS

FIG. 5 illustrates an isometric view of a first three-dimensional crossbar array system that represents an embodiment of the present invention.

DETAILED DESCRIPTION

Various embodiments of the present invention are directed to three-dimensional crossbar array systems, which can be configured to store and process information. Certain three-dimensional crossbar array system embodiments of the present invention are based on a plurality of two-layer nanowire crossbars, which are described in a first subsection. Other three-dimensional crossbar array system embodiments of the present invention are based on a plurality of three-layer nanowire crossbars, which are described in a second subsection. In general, the three-dimensional crossbar array system embodiments of the present invention provide a higher density of crossbar junctions than a single two- or three-layer crossbar array system occupying the same surface area.

Figure 1:
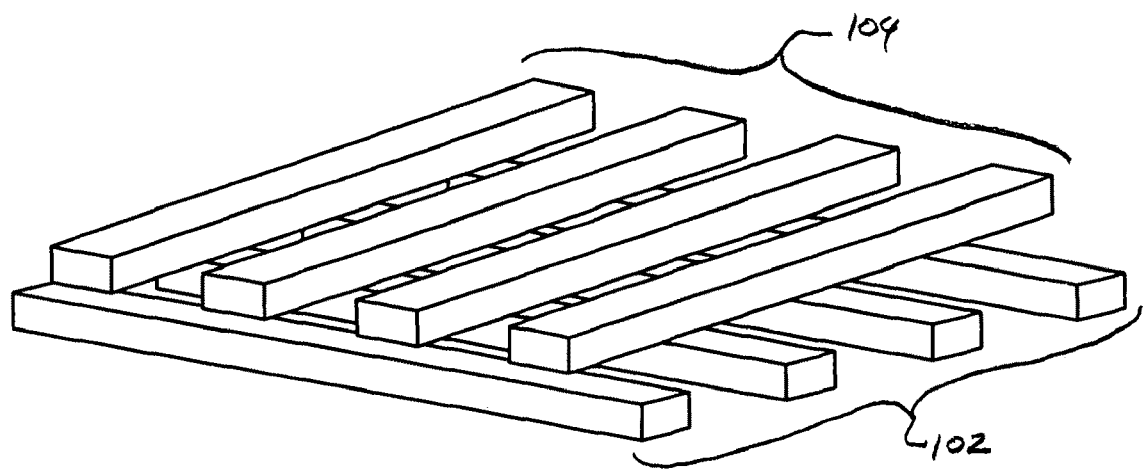
FIG. 1 illustrates a two-layer nanowire crossbar array.

I. Three-dimensional Crossbar Array System Embodiments based on Two-layer Nanowire Crossbars A. Two-layer Nanowire Crossbars FIG. 1 illustrates a two-layer nanowire crossbar array. In FIG. 1, a first layer of approximately parallel nanowires 102 is overlain by a second layer of approximately parallel nanowires 104. The second layer 104 is roughly perpendicular, in orientation, to the nanowires of the first layer 102, although the orientation angle between the layers may vary. The two layers of nanowires form a lattice, or crossbar, where each nanowire of the second layer 104 overlays all of the nanowires of the first layer 102 and comes into close contact with each nanowire of the first layer 102 at nanowire intersections that represent the closest contact between two nanowires. Although individual nanowires in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

Nanowire layers can be fabricated by mechanical nanoimprinting techniques. Alternatively, nanowires can be chemically synthesized and can be deposited as layers of approximately parallel nanowires in one or more process steps, including Langmuir-Blodgett processes. Other alternative techniques that are well-known in the art for fabricating nanowires may also be employed. Thus, a two-layer nanowire crossbar comprising first and second layers, as shown in FIG. 1, can be fabricated by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

Figure 2:
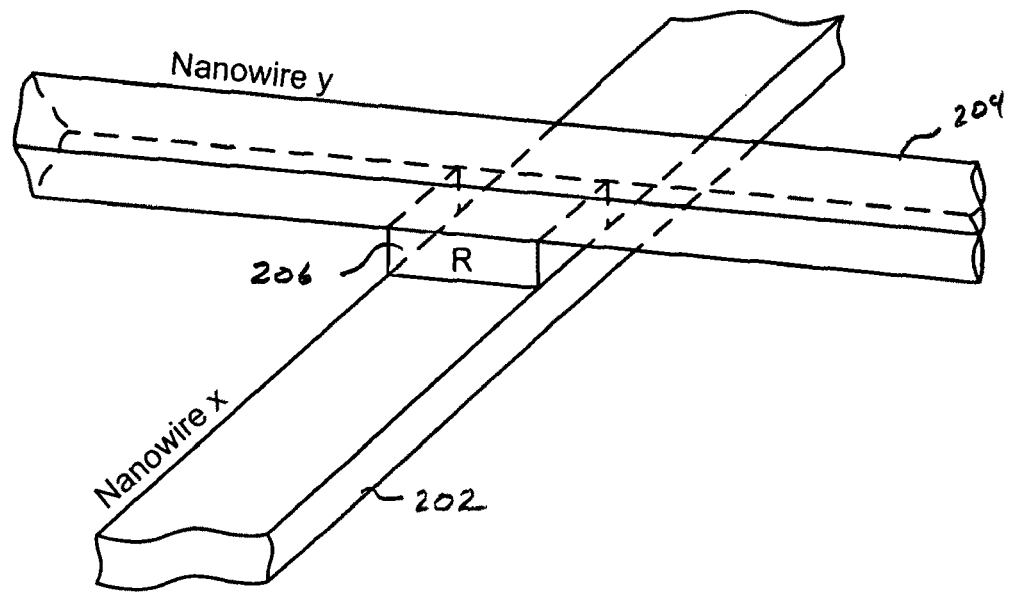
FIG. 2 illustrates of a crossbar junction interconnecting nanowires of two contiguous layers within a two-layer nanowire crossbar.

At nanowire intersections, nanoscale electronic components, such as resistors, and other familiar basic electronic components, can be fabricated to interconnect two overlapping nanowires. A nanowire intersection connected by electronic components is called a "crossbar junction" or simply a "junction." FIG. 2 provides an illustration of a crossbar junction that interconnects nanowires 202 and 204 of two contiguous layers within a nanowire crossbar. The crossbar junction may or may not involve physical contact between the two nanowires 202 and 204. As shown in FIG. 2, the two nanowires are not in physical contact at their overlap point, but the gap between the nanowires 202 and 204 may be spanned by a number of molecules represented by a resistive element 206 that lies between the two nanowires at their closest overlap point. The resistive element 206 may represent one or more molecules that behave as a resistor. In certain embodiments of the present invention, the resistive element 206 may be introduced in a separate layer, referred to as "intermediate layer," formed between the layers of overlapping nanowires. In other embodiments of the present invention, the resistive element 206 may be the active region of an electromagnetically actuated switch described in the U.S. Patent Application titled "Electronically Actuated Switch," U.S. application Ser. No. 11/542,986, filed Oct. 3, 2006 and herein incorporated by reference.

Figure 3:
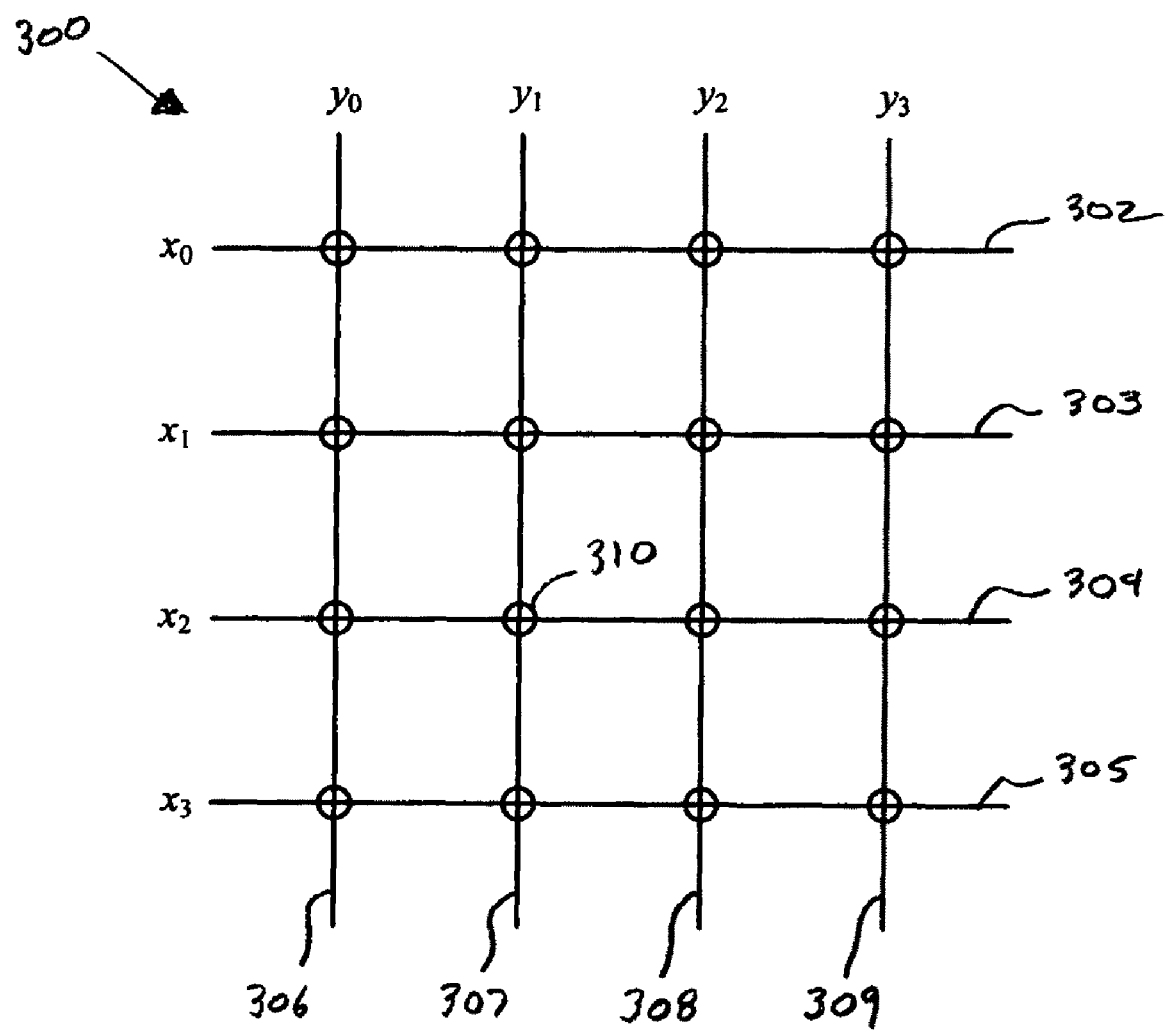
FIG. 3 illustrates a schematic representation of the two-layer nanowire crossbar shown in FIG. 1.

FIG. 3 provides a schematic representation 300 of the two-layer nanowire crossbar shown in FIG. 1. As shown in FIG. 3, the two layers of nanowires 102 and 104 are represented by horizontal and vertical lines, respectively. In particular, the horizontal lines 302-305 represent the nanowires in the first layer of nanowires 102 and are labeled $x_0$, $x_1$, $x_2$, and $x_3$, respectively. The vertical lines 306-309 represent nanowires in the second layer of nanowires 104 and are labeled $y_0$, $y_1$, $y_2$, and $y_3$, respectively. The resistive elements located at crossbar junctions are represented by circles, such as circle 310. The x and y nanowire labels can be used to specifically identify particular crossbar junctions in the same way x and y Cartesian coordinates are used to label points in the xy-plane. For example, the crossbar junction 310 has coordinates $(x_2, y_1)$. The schematic representations shown in FIG. 3 are used throughout the remainder of this subsection to illustrate various embodiments of the present invention.

B. Nanowire Crossbar Junctions

The resistance properties of crossbar-junction molecules can vary according to the particular molecular configuration or electronic state of the crossbar-junction molecules. In some cases, changes in the state of crossbar-junction molecules may be irreversible. Two-layer nanowire crossbars having irreversible crossbar-junction molecules at crossbar junctions may be used to form programmable electronic devices, such as read only memory devices ("ROM"). In other cases, the crossbar-junction molecules may be conductive, but the molecules may be irreversibly damaged, along with portions of the nanowires proximal to the crossbar junctions, through application of very high voltages, resulting in disrupting conductivity between the two nanowires and breaking of an electrical connection between them. In yet other cases, the crossbar-junction molecules may transition reversibly from one state to another and back, so that the resistive elements configured at crossbar junctions may be reconfigured, or programmed, by application of differential voltages to selected crossbar junctions. Two-layer nanowire crossbars having reconfigurable crossbar-junction molecules at crossbar junctions may be used to form reprogrammable electronic devices, such as random access memory ("RAM").

The molecules spanning a crossbar junction, as shown in FIG. 2, may have various different states in which the molecules exhibit resistive, semiconductor-like, or conductive electrical properties. The states, and relative energies of the states, of the crossbar-junction molecules may be controlled by applying differential current levels or voltages to the overlapping nanowires forming the crossbar junction. For example, certain states of a crossbar-junction molecule can be set by applying voltages to nanowires of a crossbar junction. The applied voltages can change the resistance state of the crossbar-junction molecule causing the crossbar-junction molecule to operate as a low-resistance resistor in one state or operate as a high-resistance resistor in another state.

Crossbar junction molecules having linear and nonlinear resistor properties can be formed at crossbar junctions to produce a variety of electronic devices. A current flowing between two overlapping nanowires interconnected by crossbar-junction molecules that operate as a linear resistor can be approximated by the current-voltage equation:

$$I = \frac{1}{R}V$$

where
R is resistance of the crossbar junction molecules;
I is current flowing through the crossbar junction; and
V is a voltage across the crossbar junction.

A current flowing between two overlapping nanowires interconnected by crossbar-junction molecules that operate as a nonlinear tunneling resistor can be modeled by the current-voltage equation:

$$I = \frac{1}{2}(ke^{aV} - ke^{-aV}) = k\sinh(aV)$$

where;
k is the quasi-conductance of the crossbar junction; and
a is a voltage scale factor.

The quasi-conductance, k, and scale factor, a, are parameters determined by the physical properties of crossbar-junction molecules. The scale factor a represents resistive properties of the crossbar junction and can be used to characterize changes in the current flowing through the crossbar junction based on changes in the voltages between the overlapping nanowires. The parameter k is analogous to the conductance, g=1/R, of a linear resistor, where R represents resistance. A nonlinear-tunneling resistor that operates in accordance with the current-voltage equation given above is called a "tunneling resistor."

Figure 4:
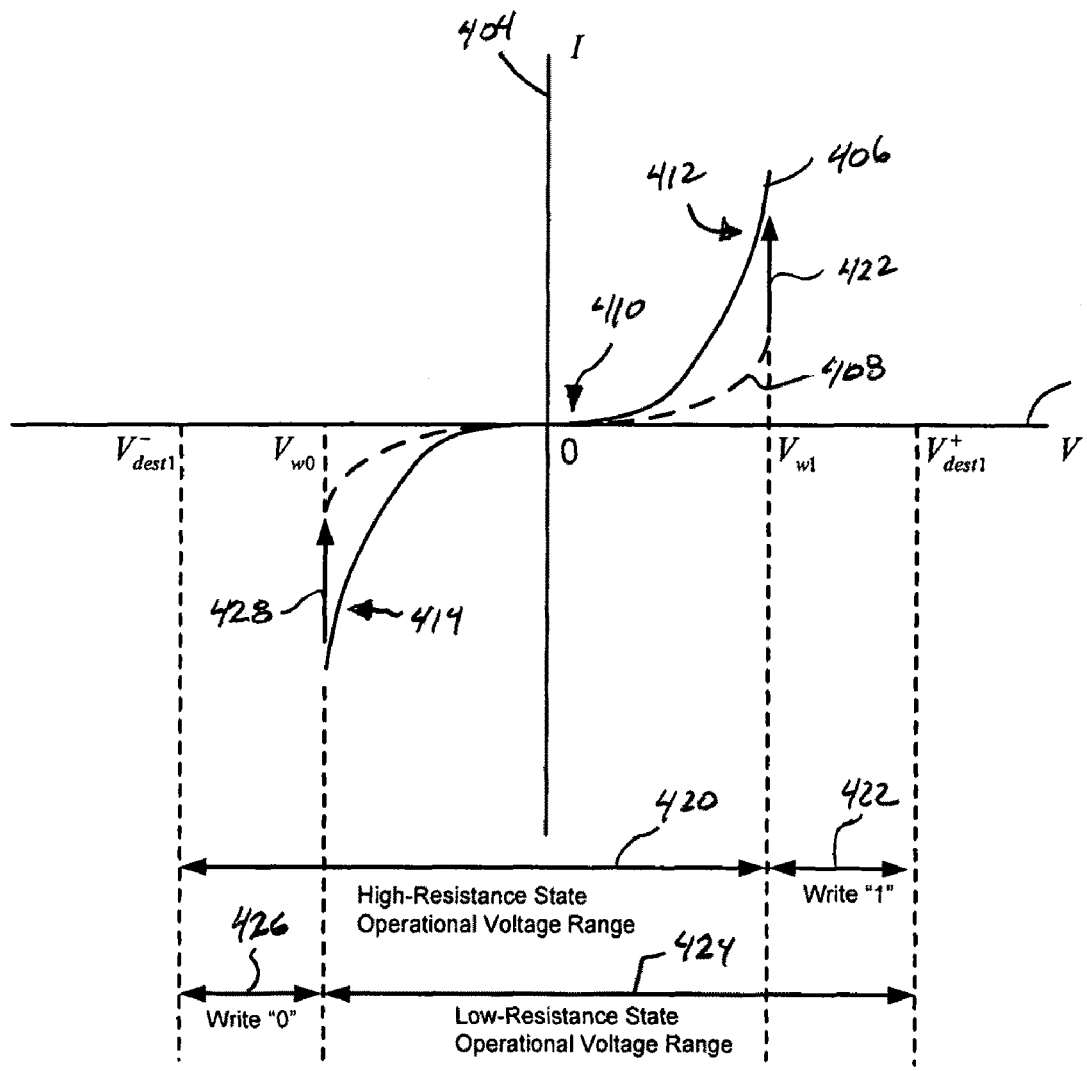
FIG. 4 shows current-versus-voltage curves that represents operational characteristics of a reconfigurable, nonlinear tunneling resistor located at a crossbar junction.

Reconfigurable linear hysteretic resistors and nonlinear tunneling hysteretic resistors are two additional types of resistors that can be used at crossbar junctions to produce reprogrammable electronic devices. These reconfigurable hysteretic resistors can be used to store bits at crossbar junctions of crossbar arrays. For example, crossbar arrays incorporating reconfigurable hysteretic resistors can be used as reconfigurable RAM. FIG. 4 shows current-versus-voltage curves ("I-V curve") that represents the operational characteristics of a reconfigurable, nonlinear tunneling resistor located at a crossbar junction. A reconfigurable, nonlinear tunneling resistor located at a crossbar junction is called a "tunneling-hysteretic resistor." In FIG. 4, horizontal line 402 represents a voltage axis, and vertical line 404 represents a current axis. I-V curve 406 represents the current-versus-voltage relationship for the tunneling-hysteretic resistor in low-resistance state, and I-V curve 408 represents the current versus voltage relationship for the same tunneling resistor in a high-resistance state. The I-V curves 406 and 408 show qualitatively different regions of behavior. For example, the I-V curve 406 has a linear region 410, a first exponential region 412, and a second exponential region 414. In the linear region 410, the tunneling-hysteretic resistor operates as a linear resistor junction with an approximate conductance given by, ka. As the magnitude of the voltage across the tunneling-hysteretic resistor decreases to zero, the resistance of the tunneling-hysteretic resistor is nearly constant, and the magnitude of the current flowing through the tunneling-hysteretic resistor decreases to zero. By contrast, in the exponential regions 412 and 414, the I-V curve 406 shows a nonlinear current-versus-voltage relationship. Applying voltages that correspond to the exponential regions 412 and 414 decreases the resistance of a tunneling-hysteretic resistor and exponentially increases the conductance, which allows more current to flow through the tunneling-resistor. In FIG. 4, voltages $V_{dest1}^-$ and $V_{dest1}^+$ represent the minimum and maximum operating voltages, respectively, that can be applied to the tunneling-hysteretic resistor represented by the I-V curves 406 and 408. Applying voltages outside the voltage range $[V_{dest1}^-, V_{dest1}^+]$ destroys the crossbar junction by irreversibly damaging the tunneling-hysteretic resistor molecules, which destroys the usefulness of the electrical connection between overlapping nanowires and renders the tunneling-hysteretic resistor inoperable through being either permanently open or permanently closed.

The resistance state of a tunneling-hysteretic resistor can be controlled by applying state-transition voltages that cause the tunneling-hysteretic resistor to alternate between two bistable resistance states. The low-resistance state represented by the curve 406 represents a Boolean value or memory state "1," and the high-resistance state represented by the curve 408 represents a Boolean value or memory state "0." Voltages $V_{w1}$ and $V_{w0}$ represent WRITE "1" and WRITE "0" threshold voltages. The tunneling-hysteretic resistor represented by the I-V curve 406 and 408 in FIG. 4 can be operated as follows. Consider the tunneling-hysteretic resistor initially in a high-resistance state represented by I-V curve 408. The tunneling-hysteretic resistor can be operated as a high-resistance state resistor by applying voltages in a voltage range $[V_{dest1}^-, V_{w1}]$ 420. However, applying a voltage in the WRITE "1" voltage range $[V_{w1}, V_{dest1}^+]$ 422, causes the tunneling-hysteretic resistor to immediately transition from the high-resistance state to the low-resistance state represented by the I-V curve 406. As a result, the tunneling-hysteretic resistor can now be operated as a low-resistance state resistor by applying voltages in a voltage range $[V_{w0}, V_{dest1}^+]$ 424. By applying a voltage in the WRITE "0" voltage range $[V_{dest1}^-, V_{w0}]$ 426, the tunneling-hysteretic resistor transitions from the low-resistance state back to the high-resistance state represented by the I-V curve 408, as indicated by directional arrow 428. The change in resistance state of a tunneling-hysteretic resistor may be modeled as a change in the junction's quasiconductance k. Note that linear hysteretic resistors exhibit nearly identical hysteretic behavior and can be similarly represented using two lines to represent the low and high-resistance states rather than the curves 406 and 408.

C. Three-dimensional Crossbar Array Embodiments

FIG. 5 provides a schematic representation of a configurable three-dimensional crossbar array system 500 that represents an embodiment of the present invention. As shown in FIG. 5, the three-dimensional crossbar array system 500 comprises a stack of three two-layer crossbar array systems 502-504 and a crossbar array demultiplexer 506. Each of the two-layer crossbar array systems 502-504 comprises a crossbar array and two nanowire demultiplexers. For example, the crossbar array system 502 comprises a crossbar array 508, represented by a dotted region, and two nanowire demultiplexers 509 and 510. The three-dimensional crossbar array system 500 is supported by an electrical insulating layer 512. Insulating layers 513 and 514 also separate the crossbar array systems 502-504 and prevent electrical interference from electrical signals transmitted in the crossbar arrays of the two-layer crossbar array systems 502-504. The insulating layers 512-514 also serve to support the nanowires of the two-layer crossbar array systems 502-504. The crossbar array demultiplexer 506 is connected via a pair of signal lines to the pair of demultiplexers of each two-layer crossbar array system. For example, the crossbar array demultiplexer 506 is connected to the demultiplexers 509 and 510 via signals lines 516 and 517, respectively.

The materials selected for the insulating layers 512-514 depends on the type of materials selected for the nanowires. For example, in certain embodiments of the present invention, the insulating layers 512-514 can be sapphire and spinel, which are suitable insulating substrates for Si-based semiconductor nanowires, because these insulators exhibit a similar thermal expansion. In other embodiments of the present invention, $SiO_2$ or a suitable polymers can be selected to fabricate the insulating layers 512-514.

Figure 6A:
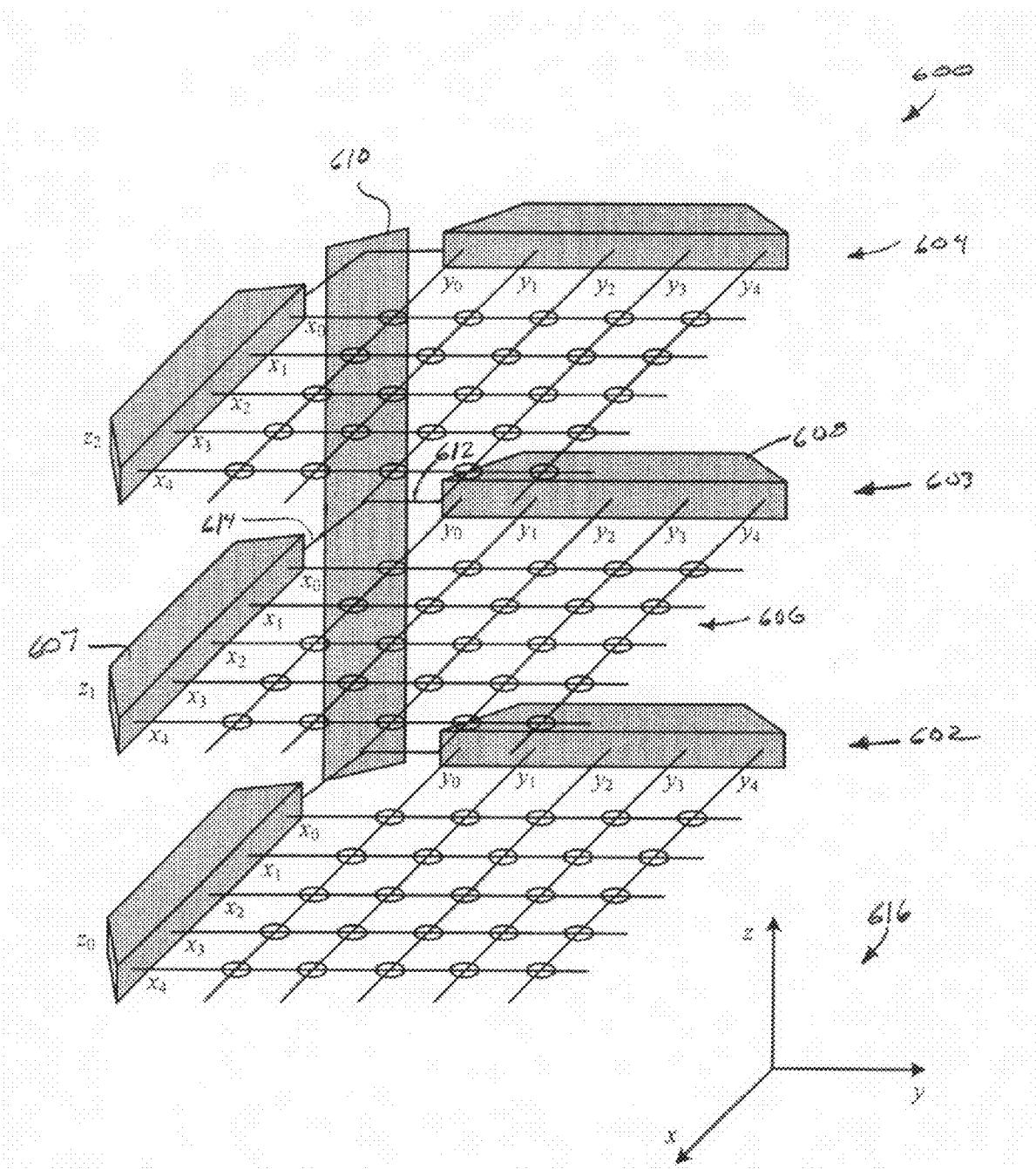
FIGS. 6A-6C illustrate an approach to configuring nanowire crossbar junctions in a three-dimensional crossbar array that represents an embodiment of the present invention.
Figure 6B:
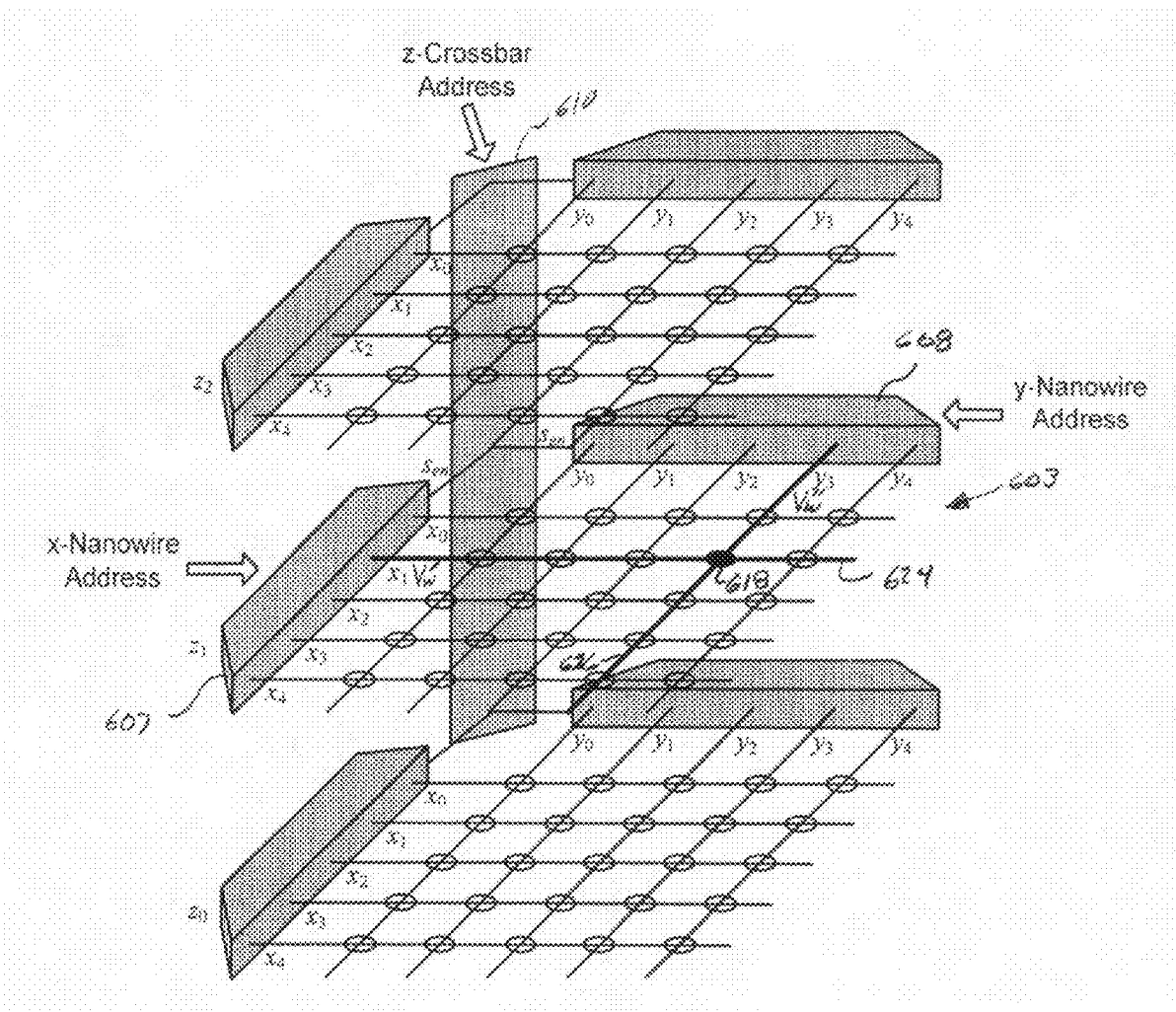
Figure 6C:
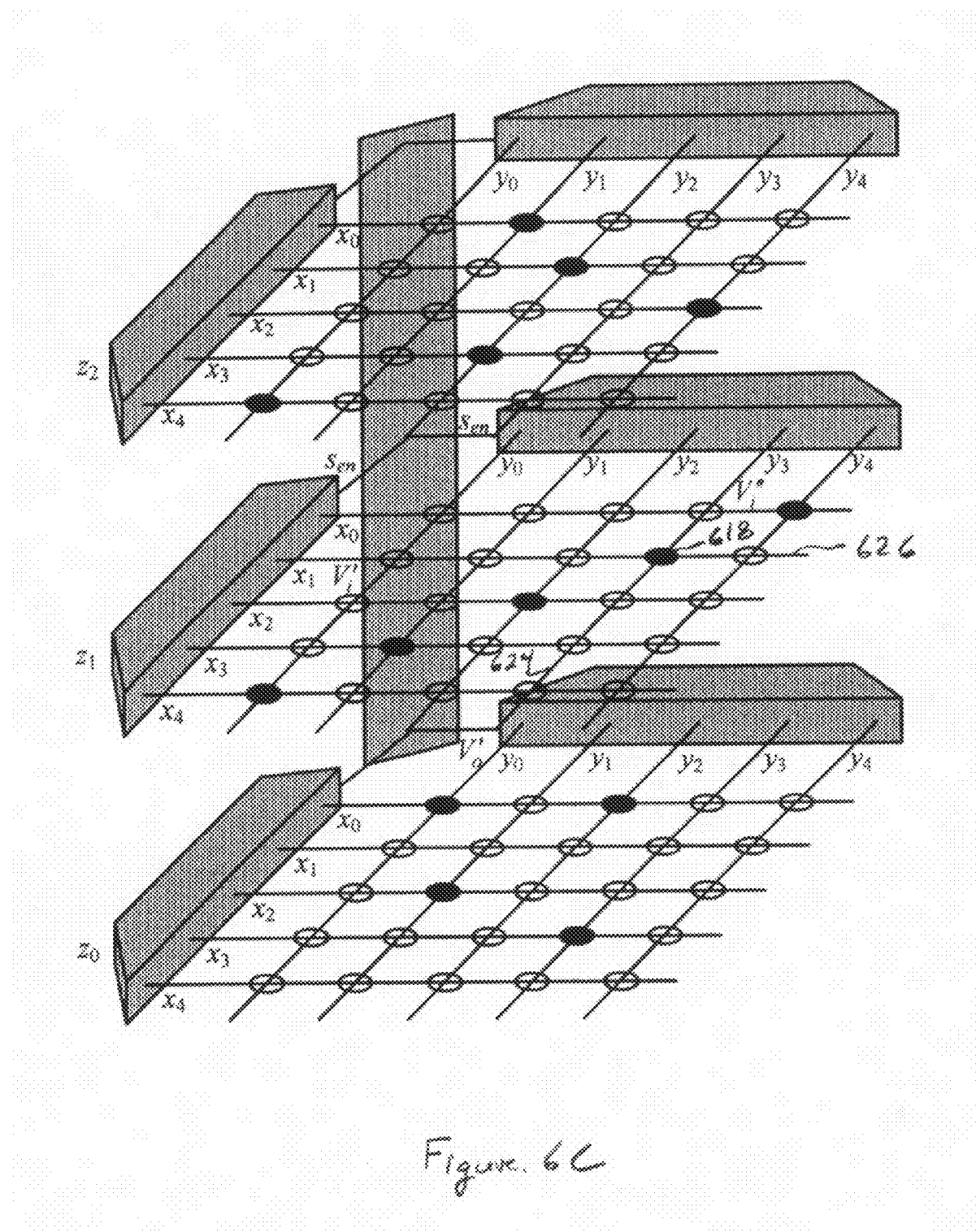

FIGS. 6A-6C illustrate an approach to configuring nanowire crossbar junctions in a three-dimensional crossbar array system 600 that represents an embodiment of the present invention. As shown in FIGS. 6A-6C, the three-dimensional crossbar array system 600 comprises three two-layer crossbar array systems 602-604. Each of the crossbar array systems 602-604 includes a crossbar array, an x-nanowire demultiplexer, and a y-nanowire demultiplexer. For example, crossbar array 603 comprises 5×5 crossbar array 606, an x-nanowire demultiplexer 607, and a y-nanowire demultiplexer 608. The three-dimensional crossbar array system 600 also includes a crossbar array demultiplexer 610. The crossbar array demultiplexer 610 is connected to the demultiplexers of each of the crossbar array systems 602-604 via signal lines. For example, signal lines 612 and 614 connect the crossbar array demultiplexer 610 to the x and y nanowire demultiplexers 607 and 608, respectively. In FIGS. 6A-6C, the circles represent crossbar junctions. The crossbar junctions can be nonreconfigurable resistors, nonreconfigurable tunneling resistors, reconfigurable resistors, or reconfigurable tunneling hysteretic resistors, as described above in section I.B. The resistance state of the crossbar-junction molecules is represented by filled and unfilled circles. For example, unfilled circles in FIGS. 6A-6C represent crossbar-junction molecules that are initially in a high-resistance state, while filled circles represent crossbar-junction molecules in a low-resistance state, which causes the crossbar-junction molecules to operate as conductors.

Each crossbar junction in the three-dimensional crossbar array system 600 can be thought of as having a unique coordinate analogous to a point in three-dimensional Cartesian coordinate space, which is represented by Cartesian coordinate system 612. As shown in FIGS. 6A-6C, for each of the crossbar array systems 602-604, the horizontal nanowires are labeled $x_0$, $x_1$, $x_2$, $x_3$, and $x_4$, and the vertical nanowires are labeled $y_0$, $y_1$, $y_2$, $y_3$, and $y_4$. The crossbar array systems 602-604 are labeled $z_0$, $z_1$, and $z_2$, respectively. Each crossbar array junction can be uniquely identified by an x and y nanowire address and a z crossbar address. For example, crossbar junction 618 has a nanowire address $(x_1, y_3, z_1)$.

As shown in FIG. 6A, the states of the crossbar junctions of the three-dimensional crossbar array system 600 are initially represented by unfilled circles. Next, as shown in FIG. 6B, each crossbar junction may be uniquely accessed by applying nanowire addresses and crossbar address to the corresponding demultiplexers. The demultiplexers 607 and 608 each receive a nanowire addresses identifying a particular nanowire and output a corresponding pattern of high and low voltages, or a pattern of oppositely polarized voltages, onto the nanowires of the crossbar array. The nanowire corresponding to the nanowires address received by the demultiplexer carries the highest voltage output. For example, in order to configure the crossbar junction $(x_1, y_3, z_1)$ 618, a nanowire address corresponding to the nanowire $x_1$ is input to the x-nanowire demultiplexer 607, a nanowire address corresponding to the nanowire $y_3$ is input to the y-nanowire demultiplexer 608, and a crossbar address corresponding to the crossbar array system $z_1$ 603 is input to the crossbar demultiplexer 610. The crossbar demultiplexer 610 transmits an enablement signal $s_{en}$ to the demultiplexers 620 and 622. Note that without the enablement signal, the x-nanowire demultiplexer 607 cannot apply a first WRITE voltage $V_w'$ to the horizontal nanowire $x_1$ 624 and the y-nanowire demultiplexer 608 cannot apply a second WRITE voltage $V_w''$ to vertical nanowire $y_3$ 626 to change the state of the crossbar junction 618 from unfilled to filled. Individual crossbar junctions may be configured through steps similar to the steps shown in FIG. 6B, resulting in a fully configured nanoscale component network shown in FIG. 6C. In FIG. 6C, filled circles, such as filled circle 618, represent crossbar junctions that have been configured by selective application of WRITE voltages. As shown in FIG. 6C, depending on the type of resistor molecules located at the crossbar junctions, the three-dimensional crossbar array system 600 can be used as a portion of an integrated circuit, such as RAM and ROM. For example, the state of the crossbar junction 618 can be READ by applying an input voltage $V_i'$ to the nanowire $x_1$ 626 and another voltage $V_i''$ to the nanowire $y_3$ to produce an output voltage $V_o'$. The level of output voltage $V_o'$ reveals the value of the bit stored in the crossbar junction 618. For example, a low voltage value for $V_o'$ may correspond to the binary number "0," and a high voltage value for $V_o'$ may correspond to the binary number "1." In general, the input and output voltages $V_i'$, $V_i''$, and $V_o'$, have relatively low magnitudes when compared to the WRITE voltages $V_w'$ and $V_w''$. Depending on the types of nanowires, types of dopants employed in the case of semiconductor nanowires, and the types of crossbar-junction molecules employed in the nanowire crossbar, many different configuring processes may be used to configure nanowire crossbars into nanowire-based electrical components networks.

Figure 7:
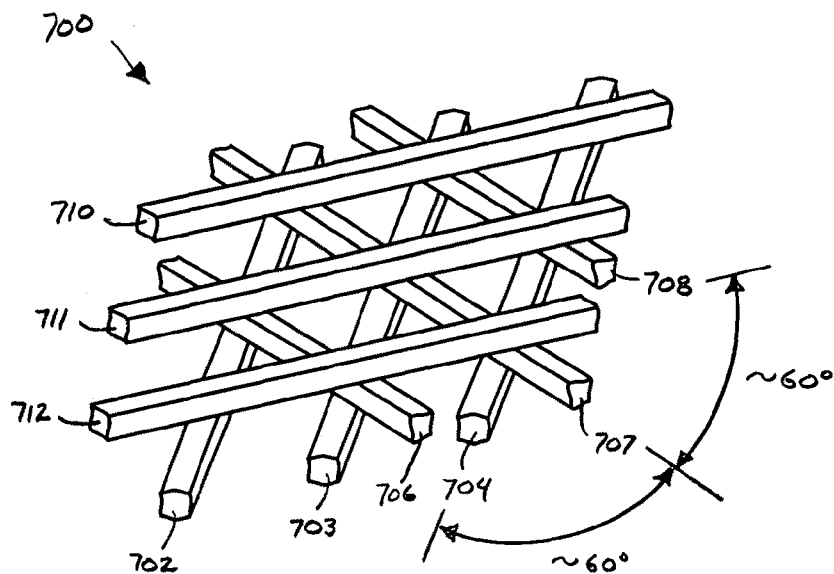
FIG. 7 illustrates a three-layer nanowire crossbar array that represents an embodiment of the present invention.

II. Three-Dimensional Crossbar Array System Embodiments based on Three-layer Nanowire Crossbars A. Three-Layer Nanowire Crossbars FIG. 7 illustrates a three-layer nanowire crossbar array 700 that represents an embodiment of the present invention. The nanowire crossbar array 700 comprises a first layer of approximately parallel nanowires 702-704 that are overlain by a second layer of approximately parallel nanowires 706-708. The nanowire crossbar array 700 also includes a third layer of approximately parallel nanowires 710-712 that overlays the second layer of approximately parallel nanowires 706-708. Although the orientation angle between the layers may vary, as shown in FIG. 7, the nanowires 706-708 in the second layer are approximately 60° in orientation to the nanowires 702-704 in the first layer, and the nanowires 710-

712 in the third layer are approximately 60° in orientation to the nanowires 706-708 of the second layer. For example, the angle between the nanowire 704 in the first layer and the nanowire 707 in the second layer is approximately 60°, and the angle between the nanowire 707 in the second layer and the nanowire 712 in the third layer is also approximately 60°. Each nanowire in the second layer overlays all of the nanowires 702-704 in the first layer, and each nanowire in the third layer overlays all of the nanowires 706-708 in the second layer. Although individual nanowires in FIG. 7 are shown with rectangular cross sections, nanowires can also have square, circular, elliptical, or more complex cross sections. The nanowires may also have many different widths or diameters and aspect ratios or eccentricities as described above with reference to FIG. 1. Methods for fabricating the nanowires in three-layer nanowires are identical to those used to fabricate two-layer nanowires describe above with reference to FIG. 1.

Figure 8:
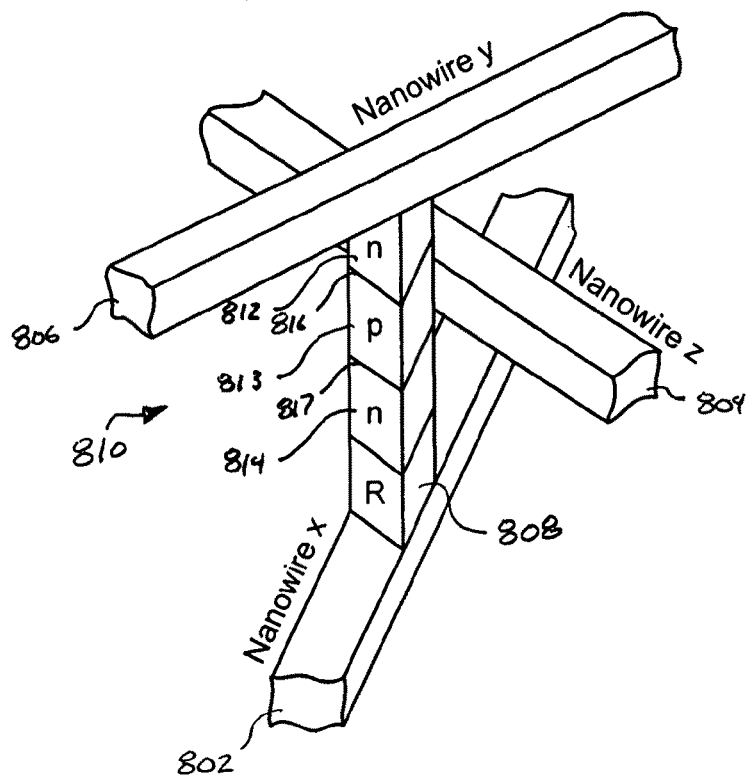
FIG. 8 illustrates a first crossbar junction interconnecting nanowires of three continuous layers within a three-layer nanowire crossbar that represents an embodiment of the present invention.

As described above with reference to FIG. 2, nanoscale electronic components, such as resistors, and other familiar basic electronic components, can be fabricated at certain crossbar junctions. FIG. 8 provides an illustration of a crossbar junction interconnecting nanowires of three continuous layers within a three-layer nanowire crossbar that represents an embodiment of the present invention. In FIG. 8, nanowires 802, 804, and 806 represent overlapping nanowires at a nanowire intersection of a three-layer nanowire crossbar. As shown in FIG. 8, nanowires 802, 804, and 806 are not in physical contact at their closest overlap points. Instead, the gap between the nanowires 802 and 806 can be spanned by a four-layered semiconductor crossbar junction 810. The crossbar comprises a resistor layer 808, a first negatively doped layer ("n-layer") 812, a positively doped layer ("p-layer") 813, and a second n-layer 814. The resistor layer 808 can be a nonreconfigurable resistor, nonreconfigurable tunneling resistor, reconfigurable resistor, or a reconfigurable tunneling hysteretic resistor, as described above in section I.B. The first n-layer 812, the p-layer 813, and the second n-layer 814 form a bipolar junction transistor ("BJT"). The p-layer 813 is doped with positive carriers and is in electrical communication with the nanowire 804. The concentration of negative carriers in the n-layers 812 and 814 can be different. The p-layer 813 and the nanowire 804 can be operated as a gate or switch that prevents or allows current to flow between the nanowires 802 and 806. Layer 816 is an np-junction, and layer 817 is a pn-junction. One of the junctions 816 and 817 may serve as a forward bias junction while the other serves as a reverse bias junction that prohibits the flow of current through the crossbar junction 810 and the BJT is said to be "off." However, when a current is applied to the nanowire 804, current can flow through the BJT and the transistor is said to be "on." In other embodiments of the present invention, a metal on semiconductor field effect transistor ("MOSFET") can also be fabricated at the crossbar junction 810 by forming a dielectric material, such as $SiO_2$, between the nanowire 804 and the p-layer 813. When a voltage is applied to the nanowire 804, current can flow through the MOSFET and the transistor is said to be "on." In other embodiments of the present invention, the resistor layer 808 may be the active region of an electromagnetically actuated switch described in the U.S. Patent Application titled "Electronically Actuated Switch," U.S. application Ser. No. 11/542,986, filed Oct. 3, 2006 and herein incorporated by reference.

Figure 9A:
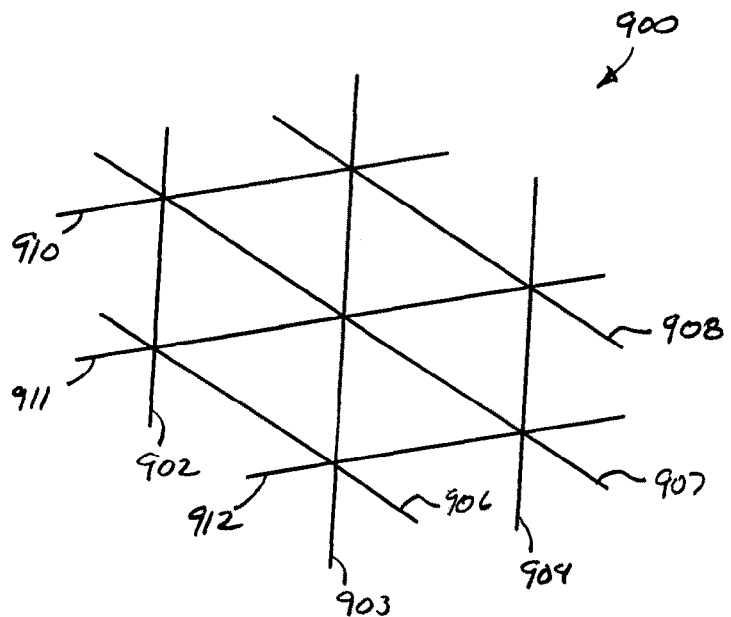
FIG. 9A illustrates a schematic representation of the three-layer nanowire shown in FIG. 7 that represents an embodiment of the present invention.
Figure 9B:
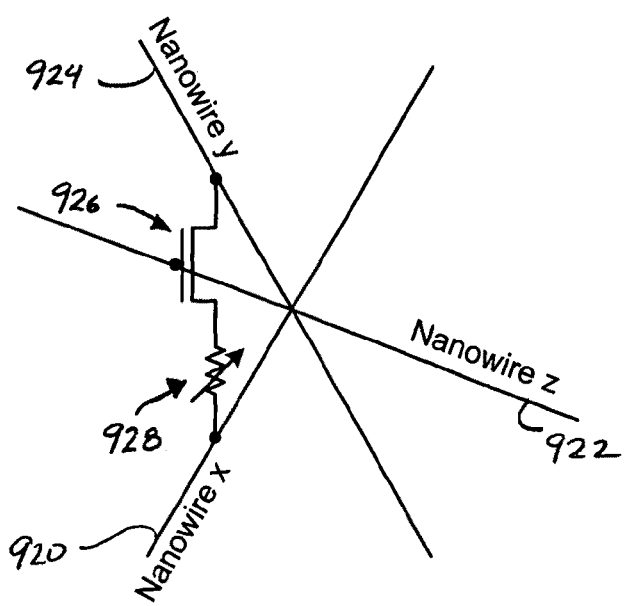
FIG. 9B illustrates a schematic representation of the crossbar junction shown in FIG. 8 that represents an embodiment of the present invention.

FIG. 9A provides a schematic representation 900 of the three-layer nanowire crossbar 700 shown in FIG. 7 that represents an embodiment of the present invention. As shown in FIG. 9A, lines 902-904 represent the nanowires 702-704, lines 906-908 represent the nanowires 706-708, and lines 910-912 represent the nanowires 710-712. FIG. 9B provides a schematic representation of the crossbar junctions shown in FIG. 8 that represents an embodiment of the present invention. As shown in FIG. 9B, lines 920, 922, and 924 correspondingly represent the nanowires 802, 804, and 806, shown in FIG. 8. The BTJ or MOSFET described with reference to FIG. 8 is represented by a transistor symbol 926, and the resistor 808 is represented by a variable resistor symbol 928.

The electronic properties of the resistor crossbar-junction molecules can vary according to the particular molecular configuration or electronic state of the crossbar-junction molecules. As described above with reference in subsection I.B., changes in the state of a resistor crossbar-junction molecule may not be reversible. In certain cases, the crossbar-junction molecules may be conductive, but the molecules may be irreversibly damaged, along with portions of the nanowires proximal to the crossbar junctions, through application of very high voltages, resulting in disrupting conductivity between the two nanowires and breaking of an electrical connection between them. In other cases, the resistor crossbar-junction molecules may transition reversibly from one state to another and back, so that the resistive elements configured at crossbar junctions may be reconfigured, or programmed, by application of differential voltages to selected crossbar junctions.

B. Three-Dimensional Crossbar Array Embodiments

Figure 10:
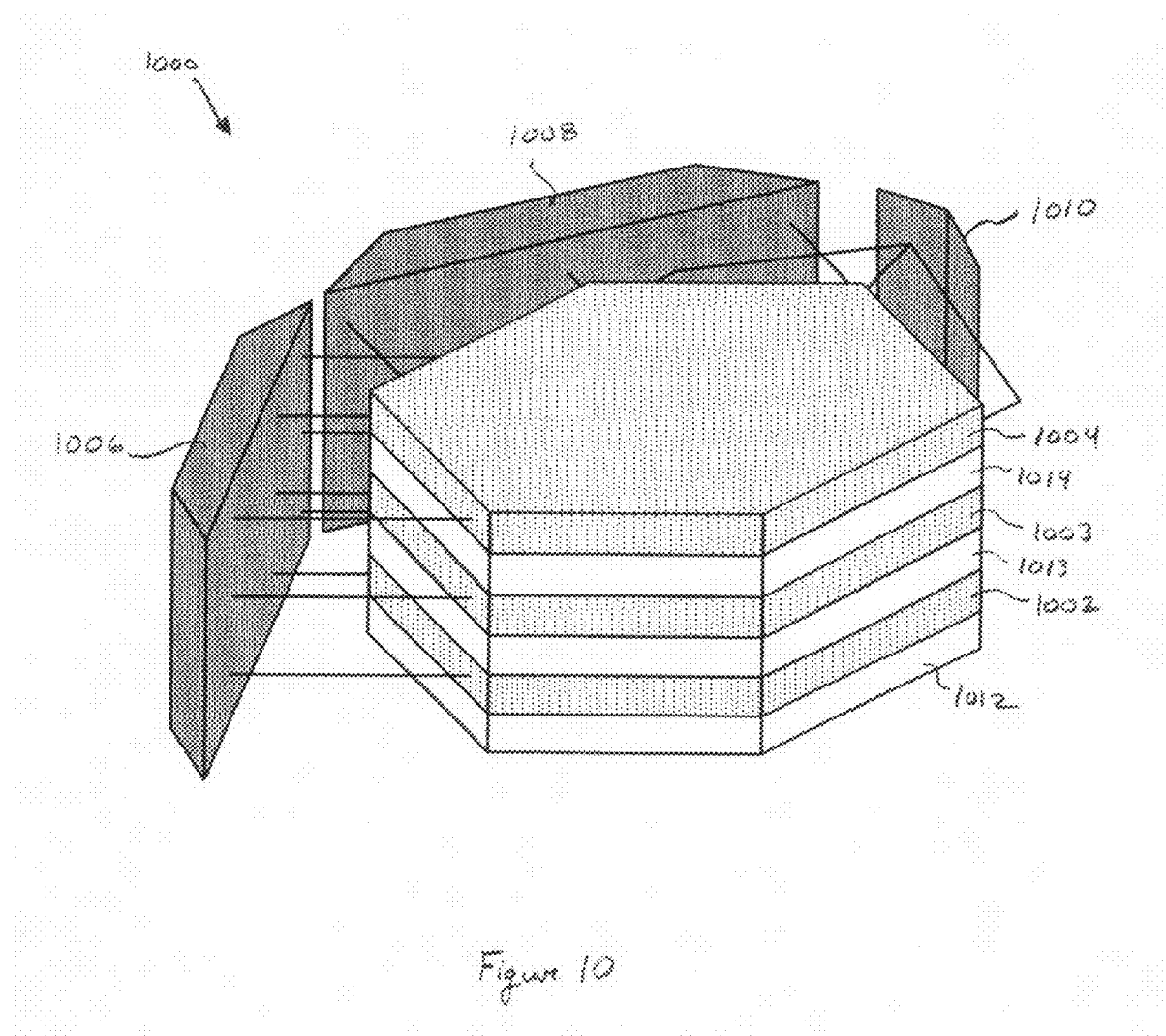
FIG. 10 illustrates an isometric view of a second three-dimensional crossbar array system that represents an embodiment of the present invention.

FIG. 10 provides an isometric representation of a three-dimensional crossbar array system 1000 that represents an embodiment of the present invention. As shown in FIG. 10, the three-dimensional crossbar array system 1000 comprises a stack of three three-layer crossbar arrays 1002-1004, an x-nanowire demultiplexer 1006, a y-nanowire demultiplexer 1008, and a crossbar-array demultiplexer 1010. The crossbar array system 1000 is supported by an electrical insulating layer 1012. Insulating layers 1013 and 1014 also separate the crossbar array systems 1002-1004 and prevent electrical interference from electrical signals transmitted in the crossbar arrays 1002-1004. The insulating layers 1012-1014 also serve to support the nanowires of the crossbar arrays 1002-1004. The x-nanowire demultiplexer 1006 is connected to the x-nanowires in each of the crossbar arrays 1002, 1003, and 1004, the y-nanowire demultiplexer 1006 is connected to the y-nanowires in each of the crossbar arrays 1002, 1003, and 1004, and the crossbar array demultiplexer 1010 is connected to the separate z-layers of nanowires.

The materials selected for the insulating layers 1012-1014 depends on the type of materials selected for the nanowires. For example, in certain embodiments of the present invention, the insulating layers 1012-1014 can be sapphire and spinel, which are suitable insulating substrates for Si-based semiconductor nanowires because these insulators exhibit a similar thermal expansion. In other embodiments of the present invention, the insulating materials selected to fabricate the insulating layers 1012-1014 can be $SiO_2$ or a suitable insulating polymer.

Figure 11:
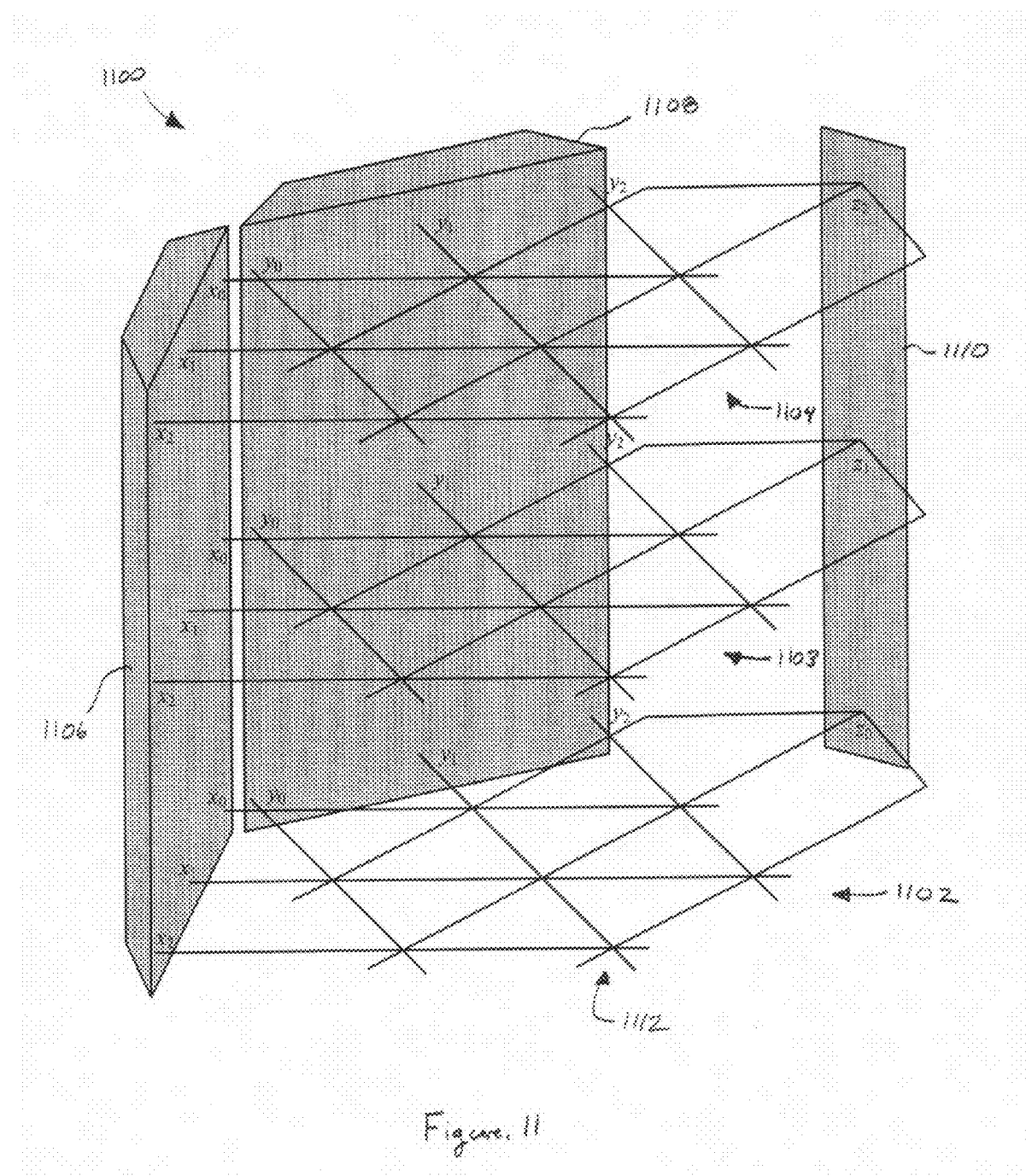
FIG. 11 provides a schematic representation of the crossbar array system shown in FIG. 10 that represents an embodiment of the present invention.

FIG. 11 provides a schematic representation 1100 of the crossbar array system 1000 shown in FIG. 10 that represents an embodiment of the present invention. The crossbar array system 1100 comprises three three-layer crossbar arrays 1102-1104, an x-nanowire demultiplexer 1106, a y-nanowire demultiplexer 1108, and a z-crossbar demultiplexer 1110. Each crossbar junction in the three-dimensional crossbar array 1100 can be thought of as having a unique coordinate analogous to a point in three-dimensional Cartesian coordinate space. As shown in FIG. 11, in each of the crossbar arrays 1102-1104, the x-layer nanowires are labeled $x_0$, $x_1$, and $x_2$, the y-layer nanowires are labeled $y_0$, $y_1$, and $y_2$. However, the z-layers of each crossbar array are identified by a single label. In particular, all the z-nanowires in the crossbar array 1102 are labeled $z_0$, all of the z-nanowires in the crossbar array 1103 are labeled $z_1$, and all of the z-nanowires in the crossbar array 1104 are labeled $z_2$. Each crossbar intersection of nanowires has a unique set of x, y, and z coordinates. For example, crossbar junction 1112 has coordinates $(x_2,y_1,z_0)$.

FIGS. 12A-12D illustrate an approach to configuring crossbar junctions of the crossbar array 1100, shown in FIG. 11, that represents an embodiment of the present invention. The example shown in FIGS. 12A-12D is meant to illustrate a general process by which nanowire crossbar junctions may be configured as useful portions of electronic circuits. For example, the three-dimensional crossbar array system 1100, shown in FIG. 11, can be a RAM device where each crossbar junction is used to store a single bit of information. A crossbar junction with a reprogrammable hysteretic resistor in a high-resistance state may correspond to the binary number "0," and a crossbar junction in a low-resistance state may correspond to the binary number "1." The crossbar-junction molecules may be reconfigurable hysteretic resistors that transition reversibly from one state to another and back, so that the resistive elements configured at crossbar junctions may be reconfigured, or programmed, by application of differential voltages to selected crossbar junctions. In the following discussion, each crossbar junction is assumed to comprise a MOSFET and a reconfigurable tunneling hysteretic resistor. Unfilled circles located at crossbar junctions shown in FIGS. 12A-12D represent reconfigurable tunneling hysteretic resistors initially in a high-resistance state, and filled circles represent resistors in a low-resistance state.

Figure 12A:
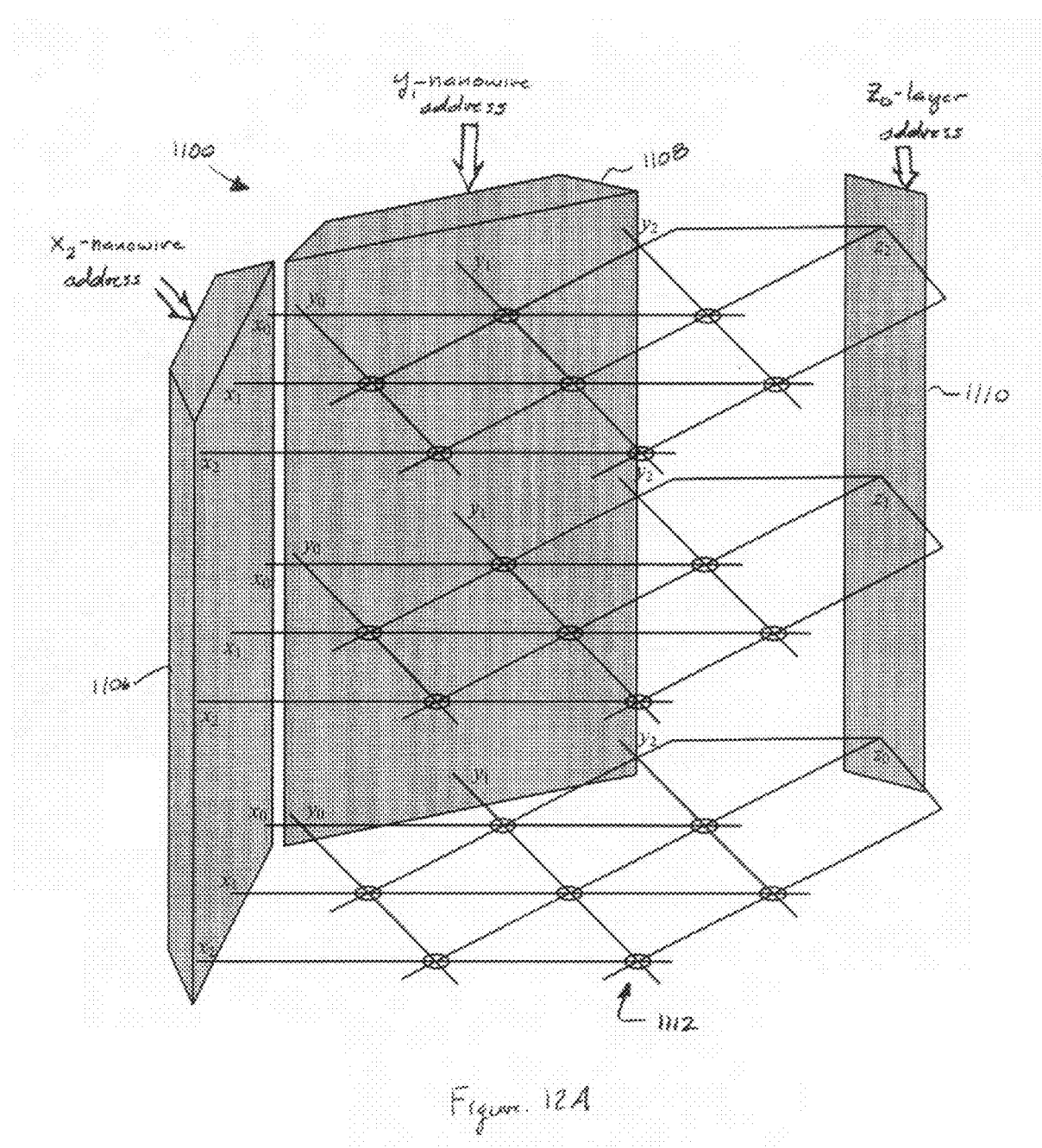
FIGS. 12A-12D illustrate an approach to configuring crossbar junctions of the crossbar array, shown in FIG. 11, that represents an embodiment of the present invention.
Figure 12B:
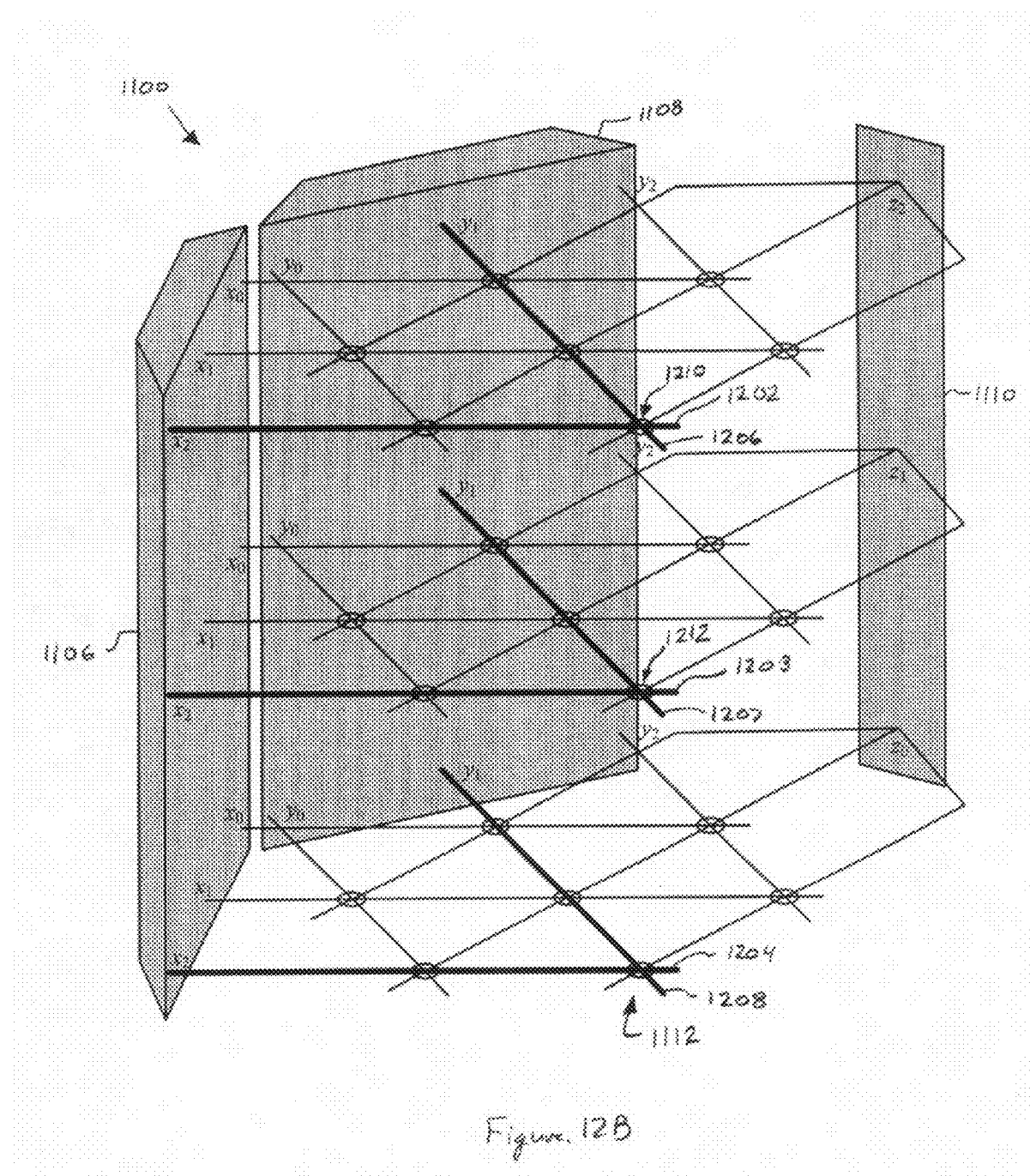
Figure 12C:
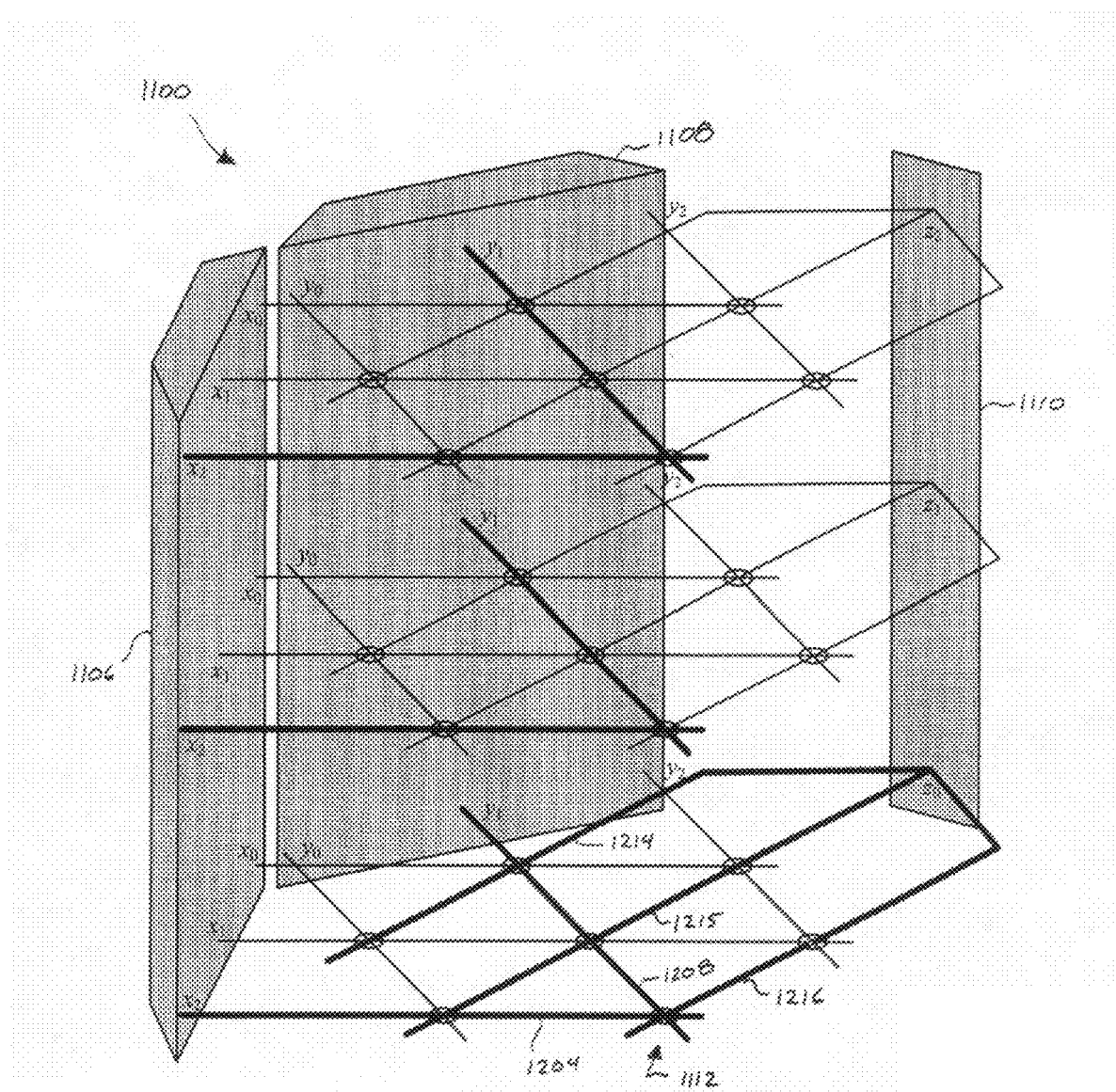
Figure 12D:
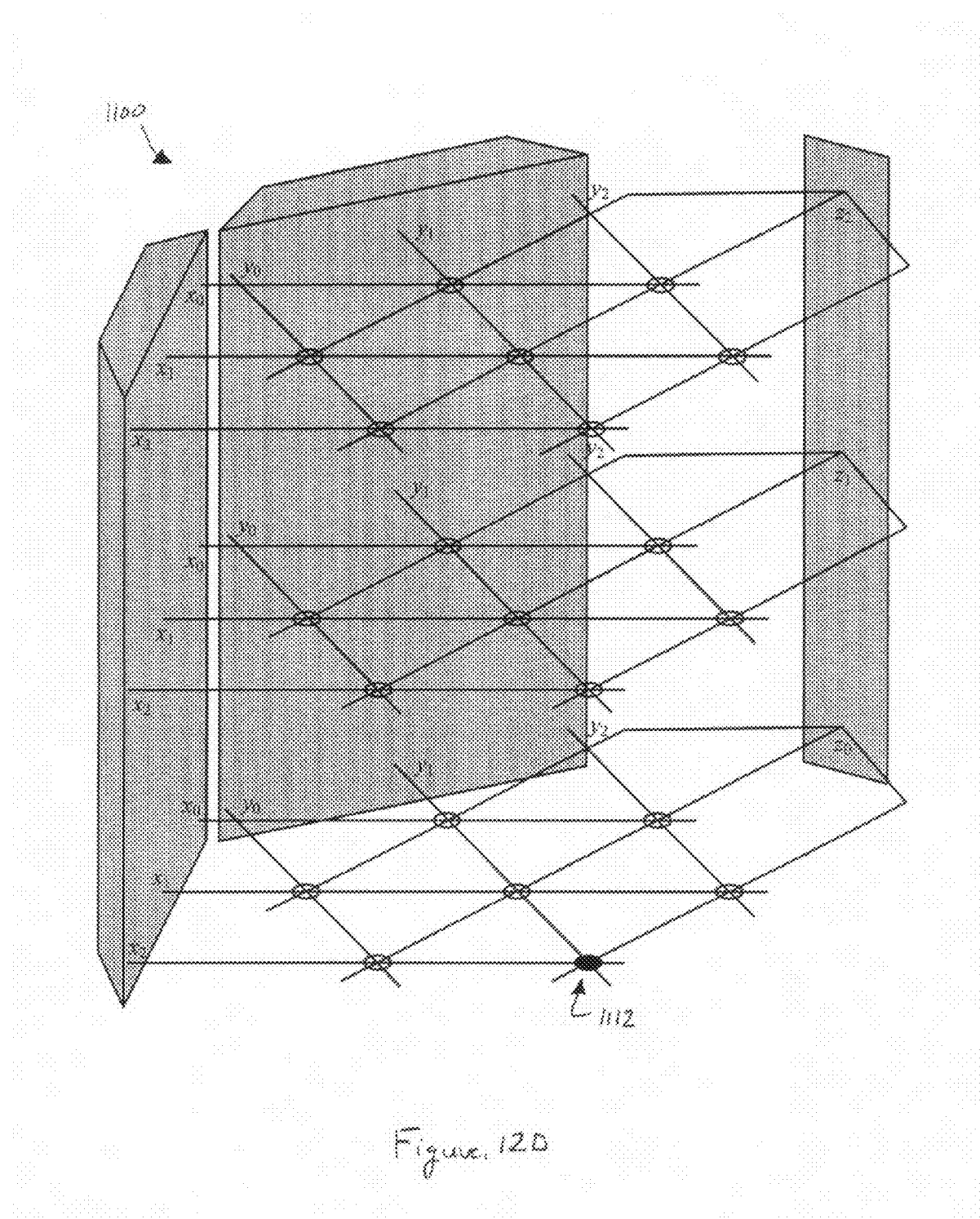

Initially, as shown in FIG. 12A, the crossbar junctions of the nanowire crossbar system 1100 are in a high-resistance state. In order to WRITE a low-resistance state to the crossbar junction $(x_2,y_1,z_0)$ 1112, the $x_2$-nanowire address is input to the x-nanowire demultiplexer 1106, the $y_1$-nanowire address is input to the y-nanowire demultiplexer 1108. The x-nanowire demultiplexer 1106 applies an appropriate voltage to every x-nanowire in the column of $x_2$-nanowires, the y-nanowire demultiplexer 1108 applies an appropriate voltage to every y-nanowire in the column of $y_1$-nanowires, and the z-nanowire demultiplexer 1110 applies a voltage to every nanowire in the $z_0$-layer of nanowires, as shown in FIG. 12B by bolded $x_2$-nanowires 1202-1204 and bolded $y_1$-nanowires 1206-1208. The voltages applied to the $x_2$-nanowires 1202-1204 and the $y_1$-nanowires 1206-1208 generate voltages across the crossbar junctions 1112, 1210, and 1212. However, the transistor located at each of the crossbar junctions is "off," so no current flows through the crossbar junctions 1112, 1210, and 1212. Next, as shown in FIG. 12C, the $z_0$-layer address input to the z-crossbar array demultiplexer 1110 causes a voltage to be applied to all of the $z_0$-layer nanowires 1214-1216, which turns the MOSFET transistors located at the crossbar junctions in the $z_0$-layer "on." In order to WRITE a low-resistance state to the crossbar junction 1112, the voltages applied to the nanowires 1204, 1208, and 1216 combine to produce a voltage across the crossbar junction 1112 with a magnitude and polarity that falls within the voltage range $[V_{w1},V_{dest1}^+]$, as described above with reference to FIG. 4. Note that the crossbar junction 1112 is the only crossbar junction in the three-layer crossbar array 1100 to receive voltages from three separate nanowires. Voltages from one or two crossed nanowires at other crossbar junctions are inadequate for changing the resistance state at these crossbar junctions. As a result, only the crossbar junction 1112 is switched into a low-resistance state, as shown in FIG. 12D. In order to WRITE a high-resistance state to the crossbar junction 1112, the voltages applied to the nanowires 1204, 1208, and 1216 combine to produce a voltage across the crossbar junction 1112 with a magnitude and polarity that falls within the voltage range $[V_{dest1}^-,V_{w0}]$, as described above with reference to FIG. 4.

A method for READING a resistance state may be identical to the method for WRITING a resistance state to a crossbar junction except the voltages applied to the corresponding nanowires combine to produce a voltage across the corresponding crossbar junction with a magnitude and polarity that falls within one of the voltage ranges $[V_{dest1}^-,V_{w1}]$ and $[V_{w0}, V_{dest1}^+]$, as described above with reference to FIG. 4.

Note that a nearly identical description applies to configuring resistors at crossbar junctions of a three-dimensional crossbar array system with BJTs located at each crossbar junction.

Figure 13:
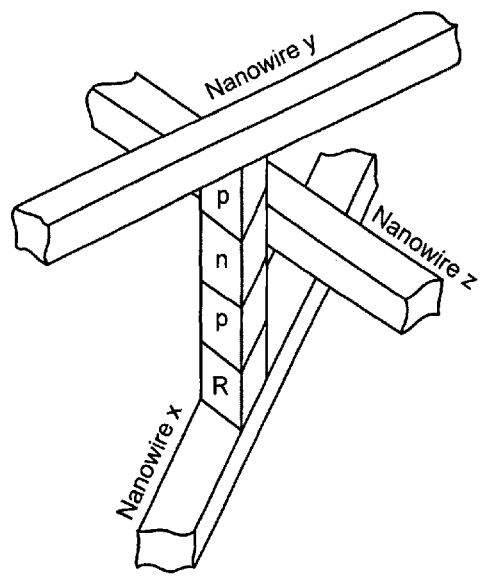
FIG. 13 illustrates a second crossbar junction that represents an embodiment of the present invention.
Figure 14A:
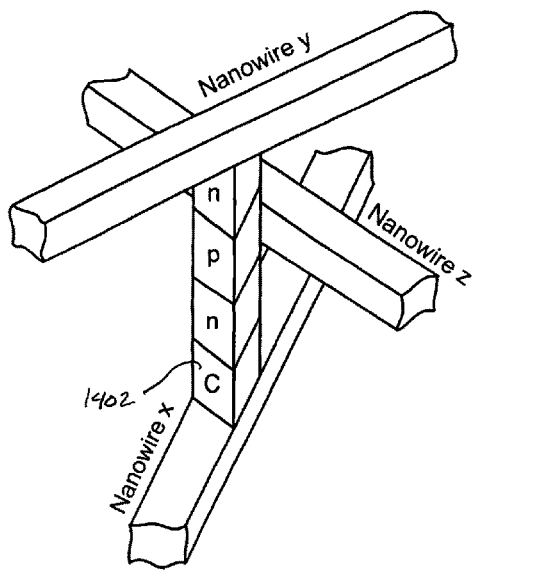
FIGS. 14A-14B illustrate a third crossbar junction that represents an embodiment of the present invention.
Figure 14B:
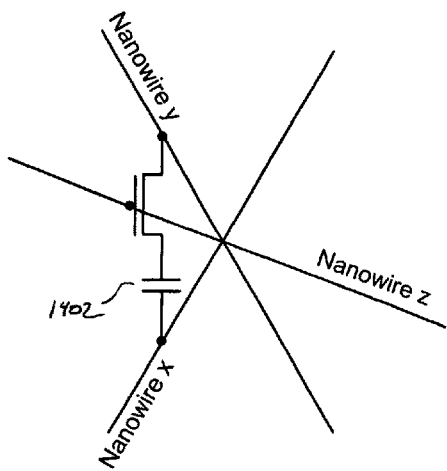

Although the present invention has been described in terms of particular embodiments, it is not intended that the invention be limited to these embodiments. Modifications within the spirit of the invention will be apparent to those skilled in the art. For example, in other embodiments of the present invention, it would be obvious to those skilled in the art to expand the number of crossbar layers to produce three-dimensional crossbar array systems. In particular, it would be obvious to those skilled in the art to produce three-dimensional crossbar array systems with four or more two-layer nanowire crossbar systems and produce three-dimensional crossbar array systems with four or more three-layer nanowire crossbars. In other embodiments of the present invention, the types of crossbar junction molecules can be varied in different layers or at specific crossbar junctions in order to fabricate a variety of different kinds of mixed electronic devices. For example, a three dimensional crossbar array system may have one layer of reconfigurable crossbar junctions, and different layer with nonreconfigurable crossbar junctions in order to form a mixed RAM and ROM device. In other embodiments of the present invention, each layer of intersecting nanowires can be partitioned according the type of crossbar junctions molecules selected for crossbar junctions. In other embodiments of the present invention, pnp bipolar transistors can be used at crossbar junctions instead of npn bipolar transistors, as shown in FIG. 13. In other embodiments of the present invention, capacitors can be used instead of reconfigurable hysteretic resistors at crossbar junctions, such as capacitor 1402 shown in FIGS. 14A-14B. In other embodiments of the present invention, MOSFET can be fabricated at the crossbar junction shown in FIG. 13 by forming a dielectric material between the z-nanowire and the n-layer and can be operated by applying a voltage to the z-nanowire.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

What is claimed is:

1. A configurable three-dimensional crossbar array system comprising:
   a plurality of crossbar arrays, each crossbar array includes a first layer of nanowires, a second layer of nanowires overlaying the first layer of nanowires, a third layer of nanowires overlaying the second layer of nanowires, and a crossbar junction located at an intersection of three overlaying nanowires;
   a first demultiplexer configured to address at least a portion of the nanowires in the first layer of nanowires of each crossbar array;
   a second demultiplexer configured to address at least a portion of the nanowires in the second layer of nanowires of each crossbar array; and
   a third demultiplexer configured to supply a signal to at least a portion of the nanowires in the third layer of nanowires of each crossbar array.

2. The system of claim 1 wherein the nanowires of the first, second, and third layers further comprise one of:
   a conductive material; and
   a semiconductor material.

3. The system of claim 1 wherein each nanowire in the second layer overlays each nanowire in the first layer, and each nanowire in the third layer overlays each nanowire in the second layer.

4. The system of claim 1 wherein at least a portion of the nanowires in the first layer of nanowires are in electrical communication with at least a portion of the nanowires in the third layer of nanowire via crossbar junctions.

5. The system of claim 4 wherein the crossbar junctions further comprise transistors that are operably connected to nanowires in the second layer of nanowires and can be operated as switches to control the flow of current between nanowires in the first layer of nanowires and nanowires in the third layer of nanowires.

6. The system of claim 5 wherein the transistor further comprises one of:
   metal on semiconductor field effect transistor;
   npn-bipolar junction transistor; and
   pnp-bipolar junction transistor.

7. The system of claim 5 wherein the nanowires in the second layer of nanowires are operated as gate electrodes.

8. The system of claim 5 wherein the crossbar junctions further comprise one of:
   a linear hysteretic resistor, and
   a nonlinear hysteretic resistor.

9. The system of claim 5 wherein the crossbar junction further comprises a capacitor.

10. A configurable three-dimensional crossbar arrays system comprising:
    a plurality of two-dimensional crossbar-memory array systems, each two-dimensional crossbar-memory array system includes a first layer of nanowires addressed by a first demultiplexer, a second layer of nanowires addressed by a second demultiplexer, and a crossbar junction located at an intersection of two overlaying nanowires; and
    a crossbar-array demultiplexer configured to transmit a first enablement signal to the first demultiplexer of each two-dimensional crossbar-memory array and a second enablement signal to the second demultiplexer of each two-dimensional crossbar-memory array.

11. The crossbar array system of claim 10 wherein the nanowires of the first and second layers further comprises one of:
    a conductive material; and
    a semiconductor material.

12. The crossbar array system of claim 10 wherein each nanowire in the second layer overlays each nanowire in the first layer.

13. The crossbar array system of claim 10 wherein each nanowire in the first layer of nanowires is in electrical communication with each nanowire in the second layer of nanowire via a resistor junction.

14. The crossbar array system of claim 13 wherein the resistor junction and the further comprise one of:
    a linear hysteretic resistor, and
    a nonlinear hysteretic resistor.

15. The crossbar array system of claim 13 wherein the resistor junction further comprises an irreversible resistor.

16. A method of accessing a crossbar junction of a three-dimensional crossbar array comprising:
    providing a plurality of crossbar arrays, each crossbar array includes a first layer of nanowires addressed by a first demultiplexer, a second layer of nanowires overlaying the first layer of nanowires addressed and addressed by a second demultiplexer, a third layer of nanowires overlaying the second layer of nanowires and addressed by a third demultiplexer, and a crossbar junction interconnecting any three overlaying nanowires;
    applying a first nanowire address of the crossbar junction to the first demultiplexer such that the first demultiplexer applies a signal to a nanowire in the first layer of nanowires connected to the crossbar junctions;
    applying a second nanowire address of the crossbar junction to the second demultiplexer such that the second demultiplexer applies a signal to a nanowire in the second layer of nanowires connected to the crossbar junctions; and
    applying a third nanowire address of the crossbar junction to the third demultiplexer such that the third demultiplexer applies a signal to a nanowire in the third layer of nanowires connected to the crossbar junctions.

17. The method of claim 16 wherein the signal applied to the nanowire is the first layer of nanowires and the signal applied to the nanowire in the second layer of nanowires produces a WRITE voltage across the crossbar junction.

18. The method of claim 16 wherein the signal applied to the nanowire is the first layer of nanowires and the signal applied to the nanowire in the second layer of nanowires produces a READ voltage across the crossbar junction.

19. The method of claim 16 wherein the signal applied to the nanowire in the third layer operates as a control signal turning the crossbar junction ON or OFF to the flow of current through the crossbar junction.

20. The method of claim 16 wherein the crossbar junction further comprises one of:
    a bipolar junction transistor; or
    a metal on silicon field effect transistor.

* * * * *